(12) United States Patent
Mun et al.

(10) Patent No.: US 10,477,687 B2
(45) Date of Patent: Nov. 12, 2019

(54) MANUFACTURING METHOD FOR EMI SHIELDING STRUCTURE

(71) Applicant: SAMSUNG ELECTRONICS CO., LTD., Suwon-si (KR)

(72) Inventors: Il-ju Mun, Suwon-si (KR); Keon Kuk, Yongin-si (KR); Ji-woon Yeom, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/488,024

(22) Filed: Apr. 14, 2017

(65) Prior Publication Data

US 2018/0042147 A1 Feb. 8, 2018

Related U.S. Application Data

(60) Provisional application No. 62/370,781, filed on Aug. 4, 2016.

(30) Foreign Application Priority Data

Nov. 18, 2016 (KR) .......................... 10-2016-0154190

(51) Int. Cl.
*H05K 1/00* (2006.01)
*H05K 1/18* (2006.01)
(Continued)

(52) U.S. Cl.
CPC .......... *H05K 1/182* (2013.01); *H01L 23/552* (2013.01); *H05K 1/0218* (2013.01);
(Continued)

(58) Field of Classification Search
CPC ........ H05K 1/182; H05K 3/284; H05K 5/065; H05K 9/0024; H05K 2001/10507;
(Continued)

(56) References Cited

U.S. PATENT DOCUMENTS 5,436,203 A 7/1995 Lin
5,641,438 A 6/1997 Bunyan et al.
(Continued)

FOREIGN PATENT DOCUMENTS

CN 101785097 A 7/2010
EP 2 187 435 A1 5/2010
(Continued)

OTHER PUBLICATIONS

Office Action dated Jun. 29 2018, issued by the U.S. Patent and Trademark Office in U.S. Appl. No. 15/061,233.
(Continued)

*Primary Examiner* — Brian K Talbot
(74) *Attorney, Agent, or Firm* — Sughrue Mion, PLLC

(57) ABSTRACT

An electromagnetic interference (EMI) shielding structure and a manufacturing method thereof are provided. The EMI shielding structure includes a shielding dam provided on a printed circuit board, the shielding dam forming a closed loop that defines a periphery of adjacent shielding regions of the printed circuit board; an insulating member that is provided on the adjacent shielding regions within the shielding dam, the insulating member covering circuit devices provided in the adjacent shielding regions; and a shielding member that covers an upper surface of the insulating member, wherein the shielding dam includes a border portion surrounding the adjacent shielding regions, and a partition portion disposed between the adjacent shielding regions and within the border portion.

6 Claims, 23 Drawing Sheets

(51) Int. Cl.
*H01L 23/552* (2006.01)
*H05K 9/00* (2006.01)
*H05K 1/02* (2006.01)
*B05D 1/26* (2006.01)
*B05D 7/00* (2006.01)

(52) U.S. Cl.
CPC ............ *H05K 9/0024* (2013.01); *B05D 1/26* (2013.01); *B05D 7/50* (2013.01); *H01L 2224/16227* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H05K 2201/09972* (2013.01); *H05K 2201/10204* (2013.01); *H05K 2203/0126* (2013.01)

(58) Field of Classification Search
CPC ......... H01L 23/522; H01L 2224/16227; H01L 2924/19041; H01L 2924/19042; H01L 2924/19043; H01L 2924/19105; H01L 2924/3025; H01L 7/50
USPC ........................................ 427/96.3
See application file for complete search history.

(56) References Cited

U.S. PATENT DOCUMENTS

| | | | |
|---|---|---|---|
| 5,650,659 | A | 7/1997 | Mostafazadeh et al. |
| 5,761,053 | A | 6/1998 | King et al. |
| 6,092,281 | A | 7/2000 | Glenn |
| 6,150,193 | A | 11/2000 | Glenn |
| 6,263,564 | B1 | 7/2001 | Holmberg et al. |
| 6,297,551 | B1 | 10/2001 | Dudderar et al. |
| 6,466,174 | B2 | 10/2002 | Haussler et al. |
| 6,601,293 | B1 | 8/2003 | Glenn |
| 6,933,894 | B2 | 8/2005 | Ghosh et al. |
| 6,962,829 | B2 | 11/2005 | Glenn et al. |
| 7,015,869 | B2 | 3/2006 | Marlow et al. |
| 7,141,869 | B2 | 11/2006 | Kim et al. |
| 7,196,275 | B2 | 3/2007 | Babb et al. |
| 7,311,937 | B2 * | 12/2007 | Hashimoto ...... G06K 19/07749 427/118 |
| 7,482,686 | B2 | 1/2009 | Zhao et al. |
| 7,633,015 | B2 | 12/2009 | Wurzel et al. |
| 7,752,751 | B2 | 7/2010 | Kapusta et al. |
| 7,981,730 | B2 | 7/2011 | Tang et al. |
| 8,071,893 | B2 * | 12/2011 | Lin .................. H05K 1/0218 174/387 |
| 8,276,268 | B2 | 10/2012 | Kapusta et al. |
| 8,314,485 | B2 | 11/2012 | Ono et al. |
| 8,633,403 | B2 | 1/2014 | Lin et al. |
| 8,881,387 | B2 | 11/2014 | Lin et al. |
| 8,971,553 | B2 | 3/2015 | Takaoka |
| 9,192,057 | B2 | 11/2015 | Malek et al. |
| 9,572,264 | B2 | 2/2017 | Yamamoto et al. |
| 9,640,858 | B1 | 5/2017 | Islam et al. |
| 9,768,154 | B2 | 9/2017 | Tomonari et al. |
| 2001/0033478 | A1 * | 10/2001 | Ortiz .................. H01R 13/6599 361/818 |
| 2004/0087043 | A1 | 5/2004 | Lee et al. |
| 2004/0231872 | A1 | 11/2004 | Arnold et al. |
| 2005/0045358 | A1 | 3/2005 | Arnold |
| 2005/0280139 | A1 | 12/2005 | Zhao et al. |
| 2007/0030661 | A1 | 2/2007 | Morris et al. |
| 2007/0176281 | A1 | 8/2007 | Kim et al. |
| 2007/0187136 | A1 | 8/2007 | Higashiguchi et al. |
| 2007/0230131 | A1 | 10/2007 | Bunyan et al. |
| 2008/0044744 | A1 | 2/2008 | Yamazaki et al. |
| 2008/0292846 | A1 | 11/2008 | Muranaga |
| 2009/0244876 | A1 | 10/2009 | Li et al. |
| 2009/0244878 | A1 | 10/2009 | Wurzel et al. |
| 2010/0045181 | A1 * | 2/2010 | Oh .................... H01L 33/005 313/512 |
| 2010/0188292 | A1 | 7/2010 | Rutfors |
| 2010/0200983 | A1 | 8/2010 | Ono et al. |
| 2010/0230789 | A1 | 9/2010 | Yorita et al. |
| 2010/0327431 | A1 | 12/2010 | Touzelbaev et al. |
| 2011/0006106 | A1 | 1/2011 | Kanryo et al. |
| 2012/0023743 | A1 | 2/2012 | Lin et al. |
| 2012/0104571 | A1 | 5/2012 | Yoo |
| 2012/0218727 | A1 | 8/2012 | Kim |
| 2012/0320558 | A1 | 12/2012 | Foster et al. |
| 2013/0083501 | A1 | 4/2013 | Azzopardi et al. |
| 2013/0114228 | A1 * | 5/2013 | Merz .................... H05K 1/0218 361/783 |
| 2013/0241039 | A1 | 9/2013 | Choi et al. |
| 2013/0286609 | A1 * | 10/2013 | Merz .................... H05K 1/0216 361/760 |
| 2014/0002310 | A1 | 1/2014 | Kim |
| 2014/0071634 | A1 | 3/2014 | Pakula et al. |
| 2014/0126157 | A1 | 5/2014 | Sawatari et al. |
| 2014/0160699 | A1 | 6/2014 | Zhang et al. |
| 2014/0198459 | A1 | 7/2014 | Cheng |
| 2014/0271961 | A1 | 9/2014 | Khoshnevis |
| 2015/0016066 | A1 | 1/2015 | Shimmura et al. |
| 2015/0022978 | A1 | 1/2015 | Steuer et al. |
| 2015/0022986 | A1 | 1/2015 | Steuer et al. |
| 2015/0036297 | A1 | 2/2015 | Chen et al. |
| 2015/0043189 | A1 | 2/2015 | Kitazaki et al. |
| 2015/0070851 | A1 | 3/2015 | Kitazaki et al. |
| 2015/0206852 | A1 | 7/2015 | Lin et al. |
| 2015/0214602 | A1 | 7/2015 | Hobson et al. |
| 2016/0066481 | A1 | 3/2016 | Malek et al. |
| 2016/0066482 | A1 | 3/2016 | Chi et al. |
| 2016/0091575 | A1 | 3/2016 | Yamada et al. |
| 2016/0157392 | A1 | 6/2016 | Happoya |
| 2016/0262292 | A1 | 9/2016 | Kuk et al. |
| 2017/0117615 | A1 | 4/2017 | Choon et al. |
| 2017/0251549 | A1 | 8/2017 | Lee et al. |
| 2017/0295679 | A1 * | 10/2017 | Kim .................. B29C 45/14639 |
| 2017/0325365 | A1 | 11/2017 | Kuk et al. |
| 2018/0116078 | A1 | 4/2018 | Mun et al. |

FOREIGN PATENT DOCUMENTS

| | | |
|---|---|---|
| JP | 6-283883 A | 10/1994 |
| JP | 2001251088 | 9/2001 |
| JP | 2004-48762 A | 2/2004 |
| JP | 2011-124598 A | 6/2011 |
| JP | 2011-146779 A | 7/2011 |
| JP | 201565343 A | 4/2015 |
| JP | 2016111026 A | 6/2016 |
| KR | 100321429 B1 | 3/2002 |
| KR | 1020060083770 A | 7/2006 |
| KR | 10-0618085 A | 8/2006 |
| KR | 10-0742098 B1 | 7/2007 |
| KR | 10-2010-0064008 A | 6/2010 |
| KR | 1020120127852 A | 11/2012 |
| KR | 10-2014-0111739 A | 9/2014 |
| KR | 10-2014-0132880 A | 11/2014 |
| KR | 1001579623 B1 | 12/2015 |
| KR | 1020160031572 A | 3/2016 |
| KR | 10-2016-0045336 A | 4/2016 |
| KR | 1020160044953 A | 4/2016 |
| KR | 1020160108117 A | 9/2016 |
| KR | 10-2017-0125690 A | 11/2017 |
| KR | 10-2018-0087551 A | 8/2018 |
| KR | 10-2018-0101831 A | 9/2018 |
| WO | 2004/047510 A2 | 6/2004 |
| WO | 2005-029937 A1 | 3/2005 |
| WO | 2016/144039 A1 | 9/2016 |
| WO | 2017/111956 A1 | 6/2017 |
| WO | 2017/191888 A1 | 11/2017 |

OTHER PUBLICATIONS

Office Action dated Aug. 9, 2018, issued by the U.S. Patent and Trademark Office in U.S. Appl. No. 15/386,823.
Communication dated May 25, 2018, issued by the European Patent Office in counterpart European Application No. 16761926.1.
Hyojun Kim, et al., "Onset condition of pulsating cone-jet mode of electrohydrodynamic jetting for plane, hole, and pin type elec-

(56) References Cited

OTHER PUBLICATIONS trodes", Journal of Applied Physics 108, 102804 (2010); American Institute of Physics, doi: 10.1063/1.3511685, URL: http://dx.doi.org/10.1063/1.3511685 (pp. 102804-1-102804-10, Total 11 pages).
Oh-Hyun Baek, et al., "3D Printing Process for Mass Production of PCB Component", Samsung, Best Paper Award 2015, Total 7 pages.
International Search Report (PCT/ISA/210) dated Jun. 27, 2016, issued by the International Searching Authority in counterpart International Application No. PCT/KR2016/002111.
Written Opinion (PCT/ISA/237) dated Jun. 27, 2016, issued by the International Searching Authority in counterpart International Application No. PCT/KR2016/002111.
Office Action dated Dec. 13, 2017 by the United States Patent and Trademark Office in U.S. Appl. No. 15/061,233.
Office Action dated Jan. 11, 2018 by the United States Patent and Trademark Office in U.S. Appl. No. 15/386,823.
Office Action dated Jan. 17, 2018 by the United States Patent and Trademark Office in U.S. Appl. No. 15/489,190.
Communication dated Feb. 21, 2018 by the European Patent Office in counterpart European Patent Application No. 16761926.1.
International Search Report and Written Opinion dated Apr. 20, 2017, issued by the International Searching Authority in counterpart International Application No. PCT/KR2017/001370 (PCT/ISA/210 & PCT/ISA/237).
Notice of Allowance dated Oct. 5, 2018, issued by the United States Patent and Trademark Office in U.S. Appl. No. 15/489,190.
International Search Report (PCT/ISA/210) dated Oct. 22, 2018, issued by the International Searching Authority in counterpart International Patent Application No. PCT/KR2018/007746.
Written Opinion (PCT/ISA/237) dated Oct. 22, 2018, issued by the International Searching Authority in counterpart International Patent Application No. PCT/KR2018/007746.
Notice of Allowance dated Oct. 30, 2018, issued by the United States Patent and Trademark Office in U.S. Appl. No. 15/386,823.
Office Action dated Nov. 29, 2018, issued by the United States Patent and Trademark Office in U.S. Appl. No. 15/061,233.
International Search Report (PCT/ISA/210) dated Dec. 17, 2018, issued by the International Searching Authority in counterpart International Patent Application No. PCT/KR2018/010501.
Written Opinion Search Report (PCT/ISA/237) dated Dec. 17, 2018, issued by the International Searching Authority in counterpart International Patent Application No. PCT/KR2018/010501.
Communication dated Feb. 12, 2019, issued by the European Patent Office in counterpart European Application No. 17792791.0.
Office Action dated Mar. 1, 2019, issued by the United States Patent and Trademark Office in U.S. Appl. No. 16/124,836.
Communication dated Jun. 27, 2019 issued by the State Intellectual Property Office in P.R. China in counterpart Chinese Patent Application No. 201780028105.X.
Office Action dated Jul. 19, 2019 issued by the United States Patent and Trademark Office in U.S. Appl. No. 16/020,386.
Communication dated Jul. 22, 2019 issued by the State Intellectual Property Office in P.R. China in counterpart Chinese Patent Application No. 201680014167.0.
Office Action dated Aug. 9, 2019 issued by the United States Patent and Trademark Office in U.S. Appl. No. 15/061,233.

\* cited by examiner

MANUFACTURING METHOD FOR EMI SHIELDING STRUCTURE

CROSS-REFERENCE TO RELATED APPLICATIONS

This application claims priority from U.S. Provisional Application No. 62/370,781, filed on Aug. 4, 2016 in the United States Patent and Trademark Office, and Korean Patent Application No. 10-2016-0154190, filed on Nov. 18, 2016 in the Korean Intellectual Property Office, the disclosures of which are incorporated herein by reference in their entirety.

BACKGROUND

1. Field of the Invention

Apparatuses and methods consistent with exemplary embodiments relate to an electromagnetic interference (EMI) shielding, and more particularly, to an EMI shielding structure configured to increase a mounting region of a printed circuit board by removing intervals between adjacent shielding regions, and a manufacturing method of the EMI shielding structure.

2. Description of the Related Art

Demands for mobile devices have rapidly increased in the recent electronic product market, and also, it is continuously demanded that the mobile devices be compacter and lighter to allow users to carry them around more easily. For implementation of the miniaturization and the light-weight of the mobile devices, it is required to have a technology to reduce an individual size of electronic components provided in the mobile devices, as well as a packaging technology to integrate a plurality of circuit devices mounted on a printed circuit board into one package. Specifically, a semiconductor package using a high frequency signal is required to be not only compact, but also equipped with an EMI shielding structure to implement excellent electromagnetic wave interference or electromagnetic durability characteristics.

A related art EMI shielding structure may include a shield can that is formed of a press-processed metallic material and covers circuit devices mounted on a printed circuit board.

When an adjacent shielding region is covered with, and shielded by using the shield can, one shield can is used per shielding region. In this case, the shield cans are disposed at certain intervals when being mounted on the printed circuit board, and side portions of each of the adjacent shield cans are kept at a certain interval. Such interval is a distance that is required to fix each shield can onto the printed circuit board. Accordingly, space for mounting the circuit devices may decrease as much as an interval reserved for installing each of the shield cans adjacent to each other on the printed circuit board increases. Therefore, there may be a problem in which the EMI shielding structure including a related art shield can degrade a high integration rate of the circuit devices.

Further, a related art EMI shielding structure may have a problem of causing increased unit price of a product, due to need for separate press processes in the fabrication of the shield cans and for expensive materials used for the shield cans.

SUMMARY

Exemplary embodiments overcome the above disadvantages and other disadvantages not described above. Also, an exemplary embodiment is not required to overcome the disadvantages described above, and an exemplary embodiment may not overcome any of the problems described above.

One of more exemplary embodiments provide an EMI shielding structure which can omit an interval between adjacent shielding regions, minimize dam shaping and processing time, and increase a mounting region of a printed circuit board, and a manufacturing method thereof.

One or more exemplary embodiments also provide an EMI shielding structure which can save a material cost by removing use of a shield can and instead forming a shielding structure with shaping and molding, and a manufacturing method using the same.

According to an aspect of an exemplary embodiment, there is provided an EMI shielding structure including: a shielding dam provided on a printed circuit board, the shielding dam forming a closed loop that defines a periphery of adjacent shielding regions of the printed circuit board; an insulating member that is provided on the adjacent shielding regions within the shielding dam, the insulating member covering circuit devices provided in the adjacent shielding regions; and a shielding member that covers an upper surface of the insulating member, wherein the shielding dam includes a border portion surrounding the adjacent shielding regions, and a partition portion disposed between the adjacent shielding regions and within the border portion.

The EMI shielding structure may further include a dummy member disposed on the printed circuit board and contacting the shielding dam.

The dummy member may further include at least one support side on which at least a portion of the shielding dam is supported.

The support side may be a plane or a curved plane.

The support side may be vertically formed, or sloped with respect to a surface of the printed circuit board on which the circuit devices are provided.

The border portion and the partition portion may be formed continuously with an electroconductive material.

The border portion may include a plurality of border portions which contact at least a portion each other.

The border portion may be discontinuously formed from the partition portion.

The partition portion may completely partition the adjacent shielding regions.

An end portion of the border portion may overlap a portion of another portion of the border portion or overlap a portion of the partition portion.

According to an aspect of another exemplary embodiment, there is provided a manufacturing method of an electromagnetic interference (EMI) shielding structure, the method including: forming a shielding dam on a printed circuit board by continuously discharging an electroconductive material through a nozzle, the shielding dam forming a closed loop that defines a periphery of adjacent shielding regions of the printed circuit board; forming an insulating member on the adjacent shielding regions within the shielding dam, the insulating member covering circuit devices provided in the adjacent shielding regions; and forming a shielding member by covering an upper surface of the insulating member with an electroconductive material.

The forming the shielding dam may include forming a border portion and a partition portion of the shielding dam of the shielding dam continuously by one material discharge process, the border portion surrounding the adjacent shielding regions, and the partition being disposed between the adjacent shielding regions and within the border portion.

The forming a shielding dam may include: moving the nozzle while the nozzle discharges the electroconductive material; stopping the nozzle at a position that is a certain distance apart from a previously formed portion of the shielding dam; while the nozzle is stopped, filling a space between the previously formed portion and the position of the nozzle by discharging the material toward the previously formed portion; and resuming moving the nozzle while the nozzle discharges the electroconductive material.

The forming the shielding dam may include: moving the nozzle while the nozzle discharges the electroconductive material; stopping the nozzle at a position that is a certain distance apart from a previously formed portion of the shielding dam; moving the nozzle to a position adjacent to the previously formed portion so that the material previously discharged from the nozzle is pushed toward and contacts the previously formed portion; and resuming moving the nozzle while the nozzle discharges the material toward the previously formed portion.

The forming the shielding dam may include: while the nozzle discharges the electroconductive material, moving the nozzle at a first speed to a first position adjacent to a previously formed portion of the shielding dam; and while the nozzle discharges the electroconductive material, moving the nozzle upwardly at a second speed from the first position to a second position that is higher than the previously formed portion, wherein the second speed is slower than the first speed.

In the forming the shielding dam, the nozzle may discharge the electroconductive material to contact at least two portions of a previously formed portion of the shielding dam while moving from a starting point to an ending point of the shielding dam.

The manufacturing method may further include, prior to the forming the shielding dam, disposing at least one dummy member on a moving path of the nozzle.

In the forming the shielding dam, the nozzle may move, while discharging the electroconductive material, toward one surface of the dummy member.

In the forming the shielding dam, the nozzle may move upwardly along a slope surface of the dummy member, while discharging the electroconductive material toward the slope surface of the dummy member.

According to an aspect of another exemplary embodiment, there is provided a computer readable recording medium storing a program that is executed by a computer to perform a manufacturing method of an electromagnetic interference (EMI) shielding structure, the method including: forming a shielding dam on a printed circuit board by continuously discharging an electroconductive material through a nozzle, the shielding dam forming a closed loop that defines a periphery of adjacent shielding regions of the printed circuit board; forming an insulating member on the adjacent shielding regions within the shielding dam, the insulating member covering circuit devices provided on the printed circuit board in the adjacent shielding regions; and forming a shielding member by covering an upper surface of the insulating member with an electroconductive material.

BRIEF DESCRIPTION OF THE DRAWINGS

The above and/or other aspects of the present inventive concept will be more apparent by describing certain exemplary embodiments of the present inventive concept with reference to the accompanying drawings, in which.

DETAILED DESCRIPTION OF EXEMPLARY EMBODIMENTS

Figure 1:
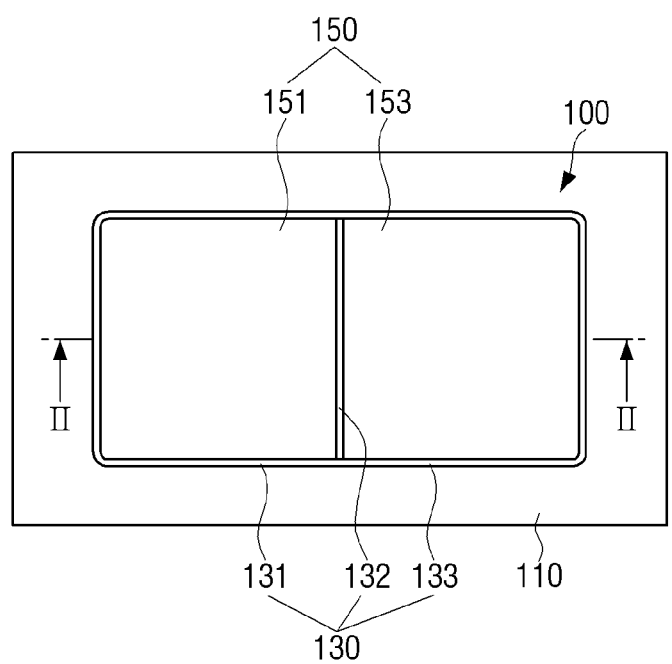
FIG. 1 is a top view illustrating an EMI shielding structure according to an embodiment.

Certain exemplary embodiments of the present inventive concept will now be described in greater detail with reference to the accompanying drawings.

In the following description, same drawing reference numerals are used for the same elements even in different drawings. The matters defined in the description, such as detailed construction and elements, are provided to assist in a comprehensive understanding of the present inventive concept. Accordingly, it is apparent that the exemplary embodiments of the present inventive concept can be carried out without those specifically defined matters. Also, well-known functions or constructions are not described in detail since they would obscure the invention with unnecessary detail.

When an element is stated as being "on" or "in contact with" another element, it is to be understood that the element may be directly contacted or connected with another element, but may also be intervened with yet another element disposed therebetween. Meanwhile, when one element is stated as being "immediately on" or "directly contacted with" another element, it may be construed that there may be no other element present in between. Other expressions for explaining relations between elements, e.g., "between," "directly between," and so on may be understood likewise.

The terms, "first," "second," and so on may be used in explaining various elements, but the elements should not be limited with such terms. The terms may be used only for a purpose of distinguishing one element from another element. For example, a first element may be named a second element without being departed from the scope of the present disclosure, and similarly, a second element may be named a first element.

A singular expression includes a plural expression unless specifically expressed otherwise in the context. Terms such as "comprise" or "have" are used to designate presence of characteristics, numbers, processes, operations, elements, components or a combination thereof described herein, and it is to be understood that one or more another characteristics, numbers, processes, operations, elements, components or a combination thereof may be added.

Unless otherwise defined in the exemplary embodiments of the present disclosure, terms may be construed as the meaning generally known to a person skilled in the art.

An EMI shielding structure according to the exemplary embodiments may be applied to a smart phone, a display apparatus, a wearable device, and so on.

According to exemplary embodiments described below, a maximum mounting region may be ensured for the circuit devices on a printed circuit board by removing an interval between adjacent shielding regions. Further, according to exemplary embodiments, process time may be saved since shielding dams having adjacent shielding regions are formed with minimum number of material discharge processes, in which case an amount of a material consumed may be minimized.

Referring to the attached drawings, the EMI shielding structures according to exemplary embodiments will be described in detail below.

Figure 2:
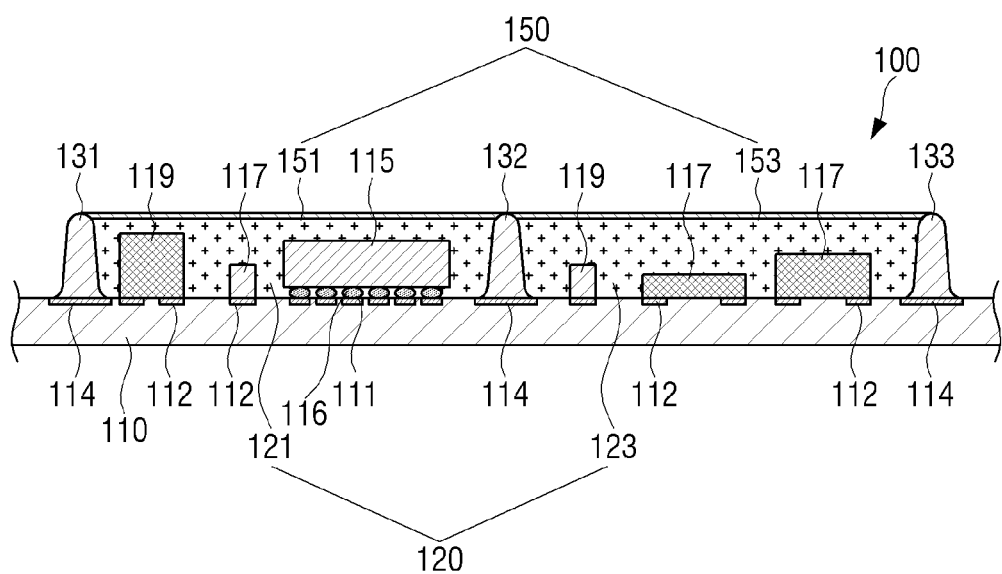
FIG. 2 is a cross sectional view taken on line II-II of FIG. 1.
Figure 3:
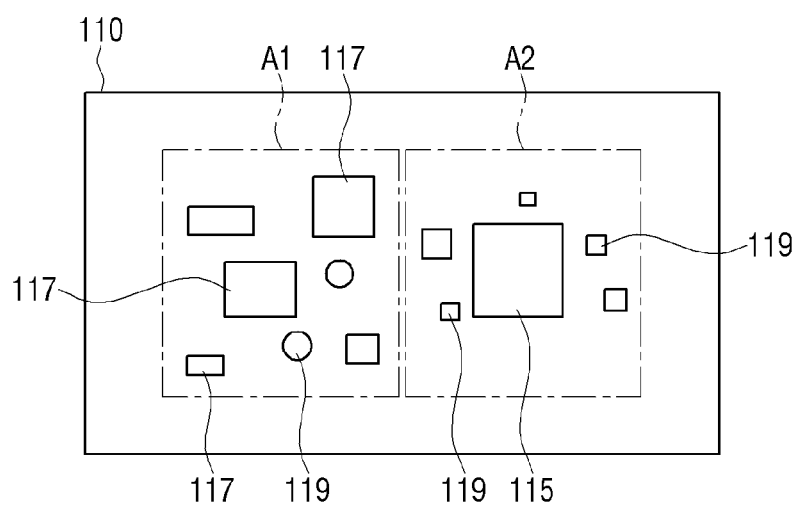
FIG. 3 is a view illustrating adjacent shielding regions to be formed on a printed circuit board according to an exemplary embodiment.

FIG. 1 is a top view illustrating the EMI shielding structure according to an exemplary embodiment, FIG. 2 is a cross sectional view taken on line II-II of FIG. 1, and FIG. 3 is a view illustrating adjacent shielding regions to be formed on the printed circuit board according to an exemplary embodiment.

Referring to FIG. 1, the EMI shielding structure 100 according to an exemplary embodiment may be formed on the printed circuit board 110 and may shield mainly two shielding regions A1, A2 (see FIG. 3). In this case, the two shielding regions A1, A2 may be partitioned by a second portion 132 of the shielding dam 130. The second portion 132 may be formed integrally with a first portion 131 and a third portion 133 of the shielding dam 130. The first and third portions 131, 133 may be border portions forming a periphery of each of the shielding regions A1, A2, and the second portion 132 may be a partition portion being formed within the border portion to partition the two shielding regions A1, A2. The shielding dam 130 may be formed when the first, second and third portions 131, 132, 133 are sequentially and continuously formed with one material discharge process without having interruption. The term "partition" as used herein commonly refers to a state in which one single closed loop is divided into two complete closed loops, or alternatively, to a state in which one single closed loop is divided partially with respect to two regions only, rather than being divided into the two complete closed loops. Further, the term "one material discharge process" herein refers to a process of moving from a standby position of a nozzle to the printed circuit board to form the shielding dam and then moving back to the standby position of the nozzle after completing shaping the shielding dam. Further, "one material discharge process" herein may indicate a process of forming the closed loops that are divided into at least two shielding regions while a shielding dam shaping material is continuously discharged from the nozzle.

Before a method for shaping the shielding dam is described, the overall constitution of the EMI shielding structure 100 according to an exemplary embodiment will be first explained.

As illustrated in FIG. 3, the EMI shielding structure 100 according to an exemplary embodiment may shield a plurality of circuit devices 115, 117, 119 mounted on the printed circuit board 110 separately as two regions A1, A2. In an example, the circuit devices may be heterogeneous circuit devices such as integrated circuit (IC) chips, passive devices, and/or release components which are mounted on the board. For example, the IC chips may be an application processor (AP), a memory, or a radio frequency (RF) chip, and the passive device may be a resistor, a condenser, or a coil, and the release component may be a connector, a card socket, an EMI shielding component, and so on.

On an upper surface of the printed circuit board 110, a first connecting pad 111 and a second connecting pad 112 to electrically connect to the circuit devices 115, 117, 119 may be patterned, respectively. The first and second connecting pads 111, 112 may be formed in plural numbers. The first and second connecting pads 111, 112 may be formed to ground the circuit devices 115, 117, 119 or deliver a signal.

A ground pad 114 may be patterned on the printed circuit board 110. The ground pad 114 may be formed within the printed circuit board 110 so as not to protrude above an upper surface of the printed circuit board 110, while an upper surface of the ground pad 114 is exposed. In this case, the ground pad 114 may be formed integrally on a ground layer 113 formed within the printed circuit board 110.

The ground pad 114 may be formed to ground the circuit devices 115, 117, 119 or deliver a signal. The shielding dam 130 to be described below may be grounded by being electrically contacted with the ground pad 114 formed along or on a portion of a forming path of the shielding dam, when being shaped on the printed circuit board 110.

The circuit device 115 may include a plurality of connecting terminals 116 which are electrically connected to the first connecting pad 111. The connecting terminals 116 may be formed with a ball grid array (BGA) method such as solder ball. However, the connecting terminals 116 are not be limited to the BGA method only. Accordingly, they may be formed with various other methods such as quad flat no lead (QFN), plastic leaded chip carrier (PLCC), quad flat package (QFP), small out line package (SOP), and thin/shrink/thin shrink SOP (TSOP/SSOP/TSSOP) according to a lead form of the unit 115.

The circuit devices 117, 119 may include at least one connecting terminal electrically connected with a second connecting pad 112 of the printed circuit board 110. A height of the circuit devices 117, 119 may be less than or greater than that of the circuit device 115, when being mounted on the printed circuit board 110. Each of the circuit devices 115, 117, 119 may be disposed at a certain interval so as not to contact the shielding dam 130.

Referring to FIG. 2, the EMI shielding structure 100 according to an exemplary embodiment may include an insulating member 120 covering the circuit devices 115, 117, 119, a shielding dam 130, and a shielding member 150 formed on an upper surface of the insulating member 120.

The insulating member 120 may be formed by injecting an insulating material into a space surrounded by the shielding dam and curing the insulating material. The insulating member 120 may include first and second insulating members 121, 123 formed by being injected into each of the shielding regions A1, A2. In each of the shielding regions A1, A2, the first and second insulating members 121, 123 may insulate the circuit devices 115, 117, 119 from each other, from the shielding dam 130, and from the shielding member 150.

An insulating material of the insulating member 120 may be tightly contacted with an outer side surface of the circuit devices 115, 117, 119, and may be formed of a material having fluidity that can enter into cracks formed between the circuit devices 115, 117, 119 and the printed circuit board 110. The insulating member 120 may be cured through various curing processes such as room-temperature curing, thermal curing, and ultraviolet (UV) curing.

The insulating material may be a material having fluidity or a phase change material (thermoplasticity, thermoset). In this case, the phase change material may include one of polyurethane, polyurea, polyvinyl chloride, polystyrene, acrylonitrile butadiene styrene (ABS resin), polyamide, acrylic, epoxy, silicone and polybutylene terephthalate (PBTP).

The shielding dam 130 may be formed as a closed loop for partitioning the two shielding regions A1, A2, while shaping an overall periphery of each of the two adjacent shielding regions A1, A2. In this case, the shielding dam 130 may be shaped as a free standing type that can form a shape by itself, i.e., without depending on another structure. However, embodiments are not limited to the above, and the shielding dam 130 may be shaped such that a portion of the shielding dam (e.g., starting portion, ending portion and intersecting portion of shaping the shielding dam) is supported with a dummy member which will be described below.

A height of the shielding dam 130 may be formed in consideration of a height of the insulating member 120 which can cover all of the circuit devices 115, 117, 119.

The shielding dam 130 may be formed with an aspect ratio in which a height is greater than a width. Herein, the aspect ratio of the shielding dam 130 is a resultant value of dividing a height of the shielding dam 130 by a width of the shielding dam 130. The aspect ratio of the shielding dam 130 may be determined by a width and a height of an outlet of a nozzle 216 (see FIG. 4) which discharges a material to form the shielding dam 130. Constitution of the nozzle 216 will be described below.

The shielding dam 130 may be formed of a conductive material having EMI shielding characteristics that can prevent EMI. Accordingly, the shielding dam 130 may prevent EMI which affects other electronic components of an electronic device including the EMI shielding structure 100 by shielding EMI generated from the circuit devices 115, 117, 119. Therefore, degradation of the reliability of a product may be prevented since disadvantages such as electromagnetic noise or malfunctions of the electronic device including the EMI shielding structure 100 are prevented. The shielding dam 130 may prevent electro-magnetic waves generated during operation of the circuit devices 115, 117, 119 from affecting external devices.

The conductive material may have a high viscosity index (100,000 cP or above) with which the shielding dam 130 can be formed at a high aspect ratio when being shaped, and can remain in an discharged shape without gravitating down after being discharged from the nozzle 216. When a material has a high viscosity index as described above, the shielding dam 130 may be shaped at a high aspect ratio, and accordingly, a height of the shielding dam 130 may be formed to be high.

Such material having a high viscosity index may be comprised of a thixotropy material having fluidity. The thixotropy material may include one of synthetic pulverizing silica, bentonite, corpuscular surface-treated calcium carbonate, hydrogen-added castor oil, metal soap, aluminum stearate, polyamide wax, polyethylene oxide, and linseed polymerized oil. For example, a metal soap may include aluminum stearate.

Further, when an electroconductive material having high viscosity is used for a double-sided printed circuit board, the shielding dam formed on a front surface will stay, i.e., will not gravitate down when the printed circuit board is turned over to form the shielding dam on a back surface immediately after the shielding dam is formed on the front surface. Accordingly, there is an advantage that the entire process may be performed efficiently.

Specifically, the electroconductive material forming the shielding dam 130 may have electroconductivity of 1.0E+04 S/m or higher. Such electroconductive material may include an electroconductive filler and a binder resin.

For an electroconductive filler, a metal such as Ag, Cu, Ni, Al, or Sn may be used, or a conductive carbon such as carbon black, carbon nanotube (CNT), or graphite may be used, or a metal coated materials such as Ag/Cu, Ag/Glass fiber, or Ni/Graphite may be used, or a conductive polymer material such as polypyrrole or polyaniline may be used. Further, the electroconductive filler may be formed as any of a flake type, a sphere type, a rod type and a dendrite type or a mixture thereof.

For the binder resin, a silicon resin, an epoxy resin, a urethane resin, or an alkyd resin may be used. The material for forming the shielding dam 130 may additionally contain additives (thickener, antioxidant, polymer surfactant and so on) and solvent (water, alcohol and so on) for other enhancements of the performance.

The shielding member 150 may be comprised of a conductive material having fluidity as the shielding dam 130, or comprised of the same material as the material of the shielding dam 130 described above.

The shielding member 150 may be formed on an upper surface of the insulating member 120. After the shielding dam 130 is formed, the insulating material is injected into an interior of the shielding dam 130 to a height that is set to be slightly lower than an upper end of the shielding dam 130. Accordingly, a space that can be filled with the shielding member 150 may be provided on an upper surface of the insulating member 120.

Upon being formed on the upper surface of the insulating member 120, the shielding member 150 may be contacted with, and electrically connected with the upper end of the shielding dam 130. Accordingly, as the shielding dam 130 and the shielding member 150 completely surround an outer side of the insulating member 120, an optimum shielding structure may be formed.

A material discharge device 200 for forming the shielding dam 130 will be explained below. The material discharge device 200 according to an exemplary embodiment may be a three-dimensional (3D) printer, for example.

Figure 4:
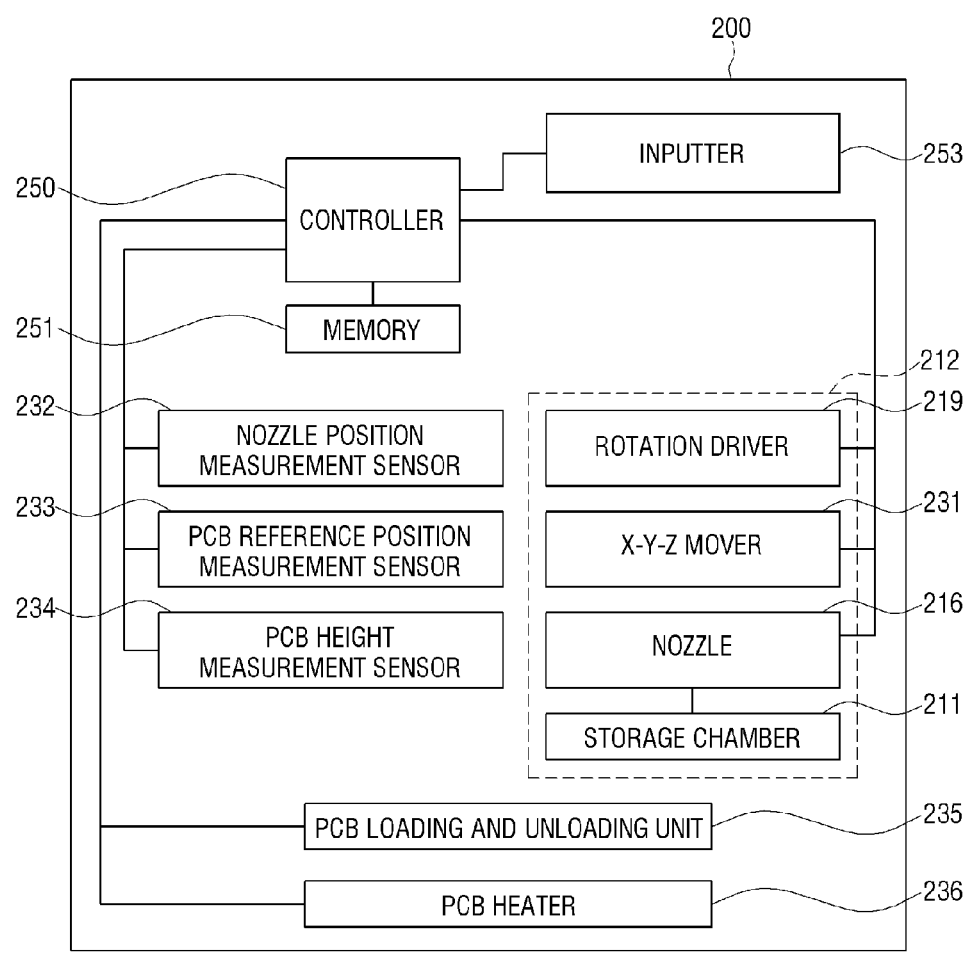
FIG. 4 is a block diagram illustrating a device to discharge a material of a shielding structure according to an exemplary embodiment.

FIG. 4 is a block diagram illustrating the material discharge device to form the shielding structure.

In this exemplary embodiment, the material discharge device 200 is provided with one nozzle 216, but embodiments are not limited thereto, and the material discharge device 200 may be provided with a plurality of nozzles in another embodiment.

Referring to FIG. 4, the material discharge device 200 may include a dispenser 212 to discharge a certain amount of material. The dispenser 212 may include a storage chamber 211 to store materials, and a nozzle 216 to discharge the materials supplied from the storage chamber 211.

Further, the dispenser 212 may include an X-Y-Z axis mover 231 to move the nozzle 216 in X, Y, and Z directions, and a rotation driver 219 to rotate the nozzle 216 clockwise and counter-clockwise or to stop the rotation thereof. The X-Y-Z axis mover 231 may include a plurality of motors to move the nozzle 216 in X, Y, and Z axes respectively, and may be coupled to a nozzle mount where the nozzle is mounted to deliver a driving force of the step motors to the nozzle 216. The rotation driver 219 may include a motor to provide rotational driving force, and an encoder to sense a rotational speed of the motor and control a rotation angle of the nozzle 216. The X-Y-Z axis mover 231 and the rotation driver 219 may be electrically connected to a controller 250 to be controlled by the controller 250.

A discharge hole of the nozzle 216 may often be cleaned or newly replaced in the material discharge device 200 or an end portion of the nozzle 216 which discharges the material may not be accurately aligned with a preset setup position in the material discharge device 200. Accordingly, the material discharge device 200 may include a nozzle position measurement sensor 232 which allows the nozzle 216 to be set to the setup position.

The PCB reference position measurement sensor 233 may be a sensor configured to determine a PCB loading regular position and may include an imaging camera. The PCB reference position measurement sensor 233 may detect whether or not the PCB, which is loaded into the working space to form the shielding structure, is located in a preset position or may detect a difference from the preset position.

The material discharge device 200 may also include a PCB loading and unloading unit 235 configured to load and unload the PCB, and a PCB heater 236 configured to raise a temperature of the PCB to a fixed value to shorten a dry time of the material.

The material discharge device 200 may include an inputter (input interface) 253 with which the user can directly input a moving path of the nozzle 216.

The inputter 253 may include a touch screen that enables touch input, or may be configured as a general key pad. The user may input a path of the nozzle through the inputter 253, in which the nozzle path may be input once and the input nozzle path data may be stored in the memory 251. It is of course possible to modify the nozzle path data later. A process of inputting a nozzle path through the inputter 253 is described below.

First, at least two reference marks indicated on the printed circuit board loaded on a work position are photographed through the imaging camera, a distance between the two reference marks are measured, and a distance value between each reference images and the two reference marks is stored in the memory 251. When the printed circuit board has a rectangular shape, the two reference marks may be indicated on the left upper end and the right lower end of the printed circuit board. In this case, a distance between the two reference marks may represent approximately a length of a straight line in a diagonal direction of the printed circuit board.

Specifically, when the printed circuit board is loaded on a work position, the user may move the imaging camera to a position of the first reference mark present on the left upper end (for example, based on a center of the first reference mark or a portion of the first reference mark) using front, back, left and right move buttons provided on the inputter 253, and press a store button provided on the inputter 253. Accordingly, the controller 250 may calculate a distance of the first reference mark from a predetermined point of origin (0, 0, 0), obtain coordinates (X1, Y1, Z1) of the first reference mark, and store the result in the memory. A photographing position of the imaging camera moving together with the nozzle may be offset by a certain interval from a center of the nozzle. Accordingly, the coordinates (X1, Y1, Z1) of the first reference mark may be calculated by the controller 250 that also considers the offset value. Further, when the user presses a photograph button, an image of the first reference mark is stored in the memory 251.

Next, the user may move the imaging camera to a position of the second reference mark present on the right lower end (e.g., based on a center of the second reference mark or a portion of the second reference mark) using the front, back, left and right move buttons provided on the inputter 253, and press the store button provided on the inputter 253. The controller 250 may calculate a distance of the second reference mark from a predetermined point of origin (0, 0, 0), obtain coordinates (X2, Y2, Z2) of the second reference mark, and store the result in the memory. Further, when the user presses the photograph button, an image of the second reference mark may be stored in the memory 251. The coordinates (X2, Y2, Z2) of the second reference mark may be calculated by the controller 250 that also considers the offset value, as described in the example of calculating the coordinates (X1, Y1, Z1) of the first reference mark.

The controller 250 may calculate an interval between the two positions by using the detected positions of the first and second reference marks, and store the result in the memory 251.

Next, while moving the imaging camera along a path of the shielding dam to be formed on the printed circuit board with the front, back, left and right move buttons of the inputter 253, and observing with his or her naked eye a real-time image photographed by the imaging camera, the user inputs a plurality of coordinates positioned on the moving path of the nozzle. The user may input corresponding coordinates by pressing a coordinate input button provided on the inputter 253 when the imaging camera is positioned on any point of the moving path of the nozzle. Such input coordinate may be stored in the memory 251.

A plurality of coordinates described above include a coordinate of a point S where the nozzle begins to discharge a material, a coordinate of a point E where the nozzle finishes discharging, and coordinates of points R1, R2, R3, R4, R5, R6 where the nozzle needs to change a direction while moving.

Further, in order to program a moving path of the nozzle, the inputter 253 may include various command buttons such as a move button to move the nozzle to a designated coordinate, a line button to command the nozzle to move and discharge a material, and a rotate button to change a moving direction of the nozzle. The user may generate a moving path of the nozzle by matching the command buttons with the coordinates and rotation angles.

As described above, when a moving path of the nozzle is programmed by the user, the controller 250 may automatically form the shielding dam on the printed circuit board by discharging a material while moving the nozzle along the moving path.

Accordingly, the nozzle path data input through the inputter 253 may be stored in the memory 251. The controller 250 may move the nozzle along a previously input path by operating the X-Y-Z axis mover 231 and the rotation driver 219 according to the nozzle path data stored in the memory 251. The nozzle path data may include a distance by which the nozzle 216 moves in a straight line direction along the upper surface of the printed circuit board 110, and rotation direction and angle of the nozzle 216.

Although in this exemplary embodiment, the user directly inputs a moving path of the nozzle through the inputter 253, embodiments are not limited thereto. A moving path of the nozzle may be previously stored in the memory 251, in which case a plurality of nozzle moving paths corresponding to respective patterns may be previously stored correspondingly to a pattern of the shielding dam that may be variously formed according to products. Further, the inputter 253 may previously store calibration information, reference position information of the nozzle, PCB reference position information, PCB reference height information, and so on in the memory 251, as well as the moving path of the nozzle.

Figure 5:
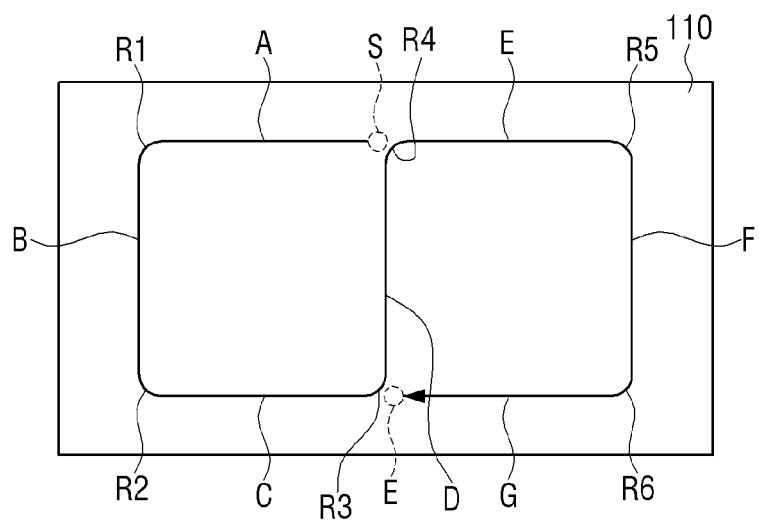
FIG. 5 is a view illustrating nozzle moving paths input through an inputter provided at a material discharge device in order to form a shielding dam of shielding regions adjacent to each other according to an exemplary embodiment.

FIG. 5 is a view illustrating a moving path of the nozzle input through the inputter provided on the material discharge device to form the shielding dam of the adjacent shielding regions.

The nozzle 216 may move along a path to form the shielding dam according to the nozzle path data, which will be described below with reference to specific examples and FIG. 5.

The nozzle 216 may be set on coordinate corresponding to the starting point S, and move in a straight line along a section A in –X axis direction by the X-Y-Z axis mover 231. The nozzle 216 may rotate by 90 degrees counter-clockwise by the rotation driver 219 at the ending point R1 of the section A, and then move in a straight line along a section B in –Y axis direction with the X-Y-Z axis mover 231. The nozzle 216 may rotate by 90 degrees counter-clockwise with the rotation driver 219 at the ending point R2 of the section B, and move in a straight line by along a section C in +X axis direction with the X-Y-Z axis mover 231. Herein, the sections A, B, and C may correspond to the first portion 131 of the shielding dam 130.

The nozzle 216 may rotate by 90 degrees counter-clockwise with the rotation driver 219 at the ending point R3 of a section C, and move in a straight line along a section D in +Y axis direction with the X-Y-Z axis mover 231. The shielding dam formed now may surround one (e.g., shielding region A1) of the two shielding regions A1, A2 in the closed loop shape. The section D may correspond to the second portion 132 of the shielding dam 130, and this may partition the two shielding regions A1, A2.

Next, the nozzle 216 may rotate by 90 degrees clockwise with the rotation driver 219 at the ending point R4 of the section D, and move in a straight line along a section E in +X axis direction with the X-Y-Z axis mover 231. The nozzle 216 may rotate by 90 degrees clockwise with the rotation driver 219 at the ending point R5 of the section E, and move in a straight line along a section F in –Y axis direction with the X-Y-Z axis mover 231. The nozzle 216 may rotate by 90 degrees clockwise with the rotation driver 219 at the ending point R6 of the section F, and move in a straight line along a section G in –X axis direction with the X-Y-X axis mover 231. In this case, the ending point of the section G may correspond to the ending point E of the shielding dam. The sections E, F, and G may herein correspond to the third portion 133 of the shielding dam 130.

As described above, according to an exemplary embodiment, the shielding dam 130 may be formed in the two shielding regions through one material discharge process of discharging a material from the nozzle continuously. As a result, time for shaping the shielding dam 130 may be reduced.

Figure 6:
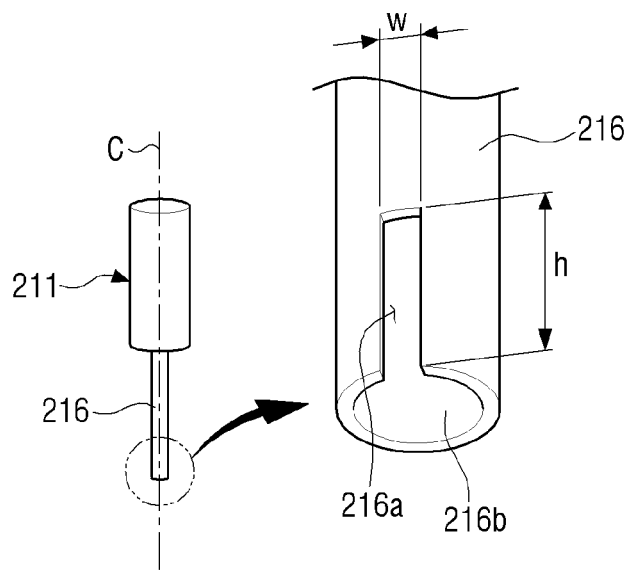
FIG. 6 is a view illustrating a nozzle of the material discharge device illustrated in FIG. 4 according to an exemplary embodiment.

FIG. 6 is a view illustrating an outlet through which a material for forming the shielding dam is discharged through the nozzle of the material discharge device.

Referring to FIG. 6, the nozzle 216 may include a first outlet 216a formed on a lower side surface of the nozzle 216 and a second outlet 216b formed on a bottom surface of the nozzle 216 to simultaneously discharge a material while being moved and rotated by the X-Y-Z axis mover 231 and the rotation driver 219. The first and second outlets 216a, 216b may be in fluid communication with each other such that the material may be discharged simultaneously through the first and second outlets 216a, 216b.

As described above, the first outlet 216a may be formed in a rectangular shape similar to a cross section of the completed shielding dam 130, in order to shape the shielding dam 130 having a large ratio between height h and width w (hereinbelow, 'aspect ratio'). According to an exemplary embodiment, an aspect ratio of the first outlet 216a indicates a resultant value of dividing the height h of the first outlet 216a by the width w of the first outlet 216a.

The shielding dam 130 may have a high aspect ratio in which a thickness decreases and a height increases as the aspect ratio of the first outlet 216a increases. The height h of the first outlet 216a may be set correspondingly to the height of the shielding dam 130, respectively.

As described above, the shielding dam 130 may be formed as the nozzle 216 simultaneously discharges materials to the upward direction of the ground pad 114 through the first and second outlets 216a, 216b, while moving along a predetermined path.

Hereinbelow, a method for forming the shielding dam 130 will be described in detail by referring to FIGS. 7 to 11.

Figure 7:
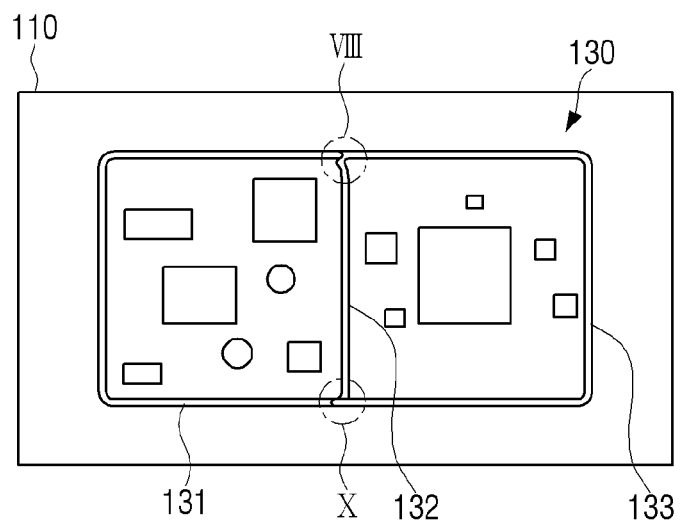
FIG. 7 is a view illustrating that a shielding dam is formed on a printed circuit board when an electroconductive material is discharged according to the nozzle moving path illustrated in FIG. 6 according to an exemplary embodiment.
Figure 8A:
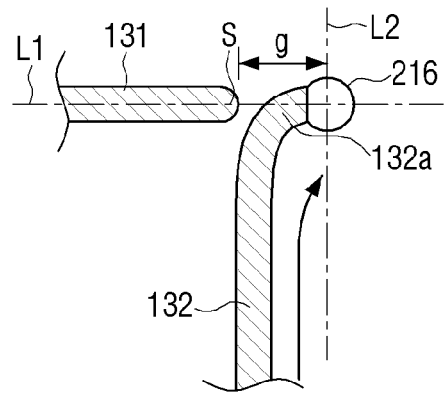
FIGS. 8A, 8B and 8C are views provided to explain a method for shaping a shielding dam in the encircled section VIII of FIG. 7 according to an exemplary embodiment.
Figure 8B:
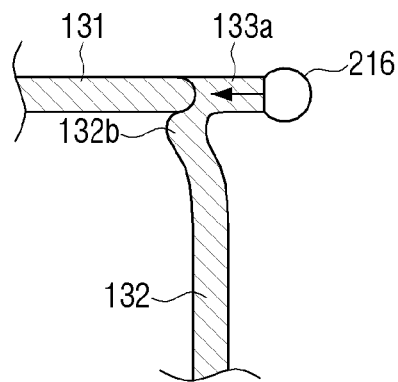
Figure 8C:
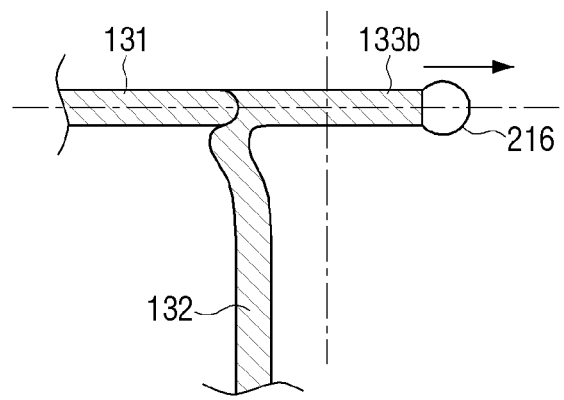
Figure 9A:
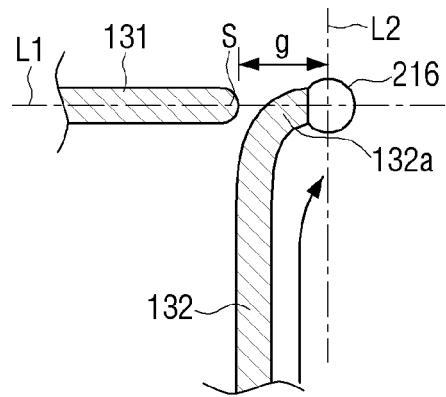
FIGS. 9A, 9B and 9C are views provided to explain another method for shaping a shielding dam in the encircled section VIII of FIG. 7 according to an exemplary embodiment.
Figure 9B:
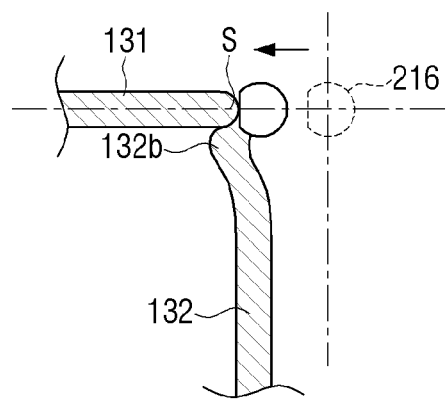
Figure 9C:
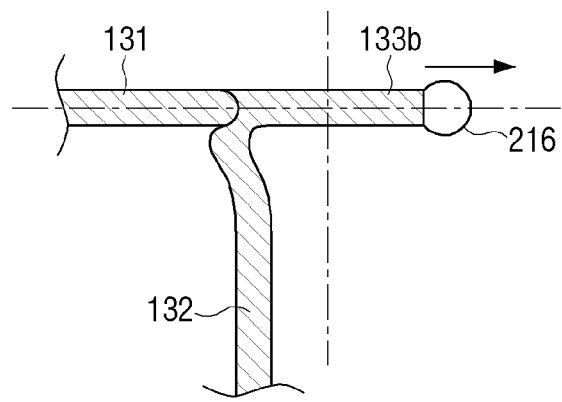
Figure 10A:
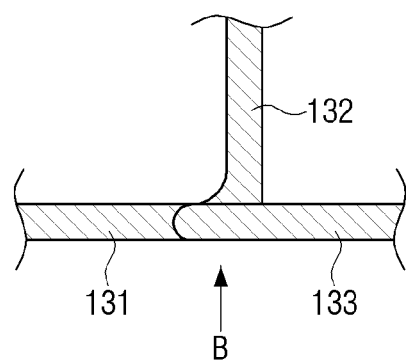
FIGS. 10A, 10B and 10C are views provided to explain a method for shaping a shielding dam in the encircled section X of FIG. 7 according to an exemplary embodiment.
Figure 10B:
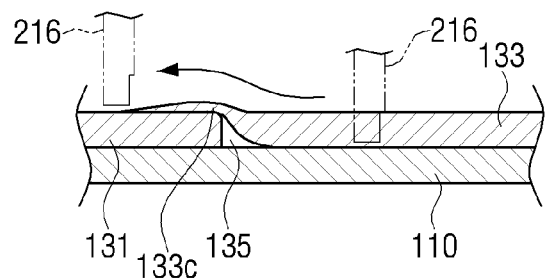
Figure 10C:
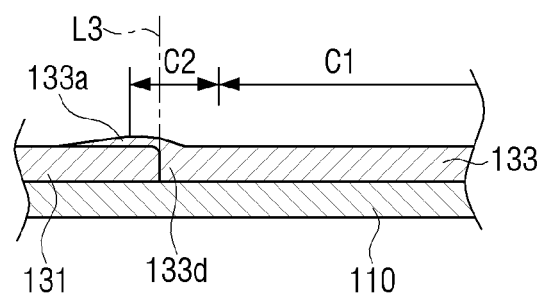
Figure 11A:
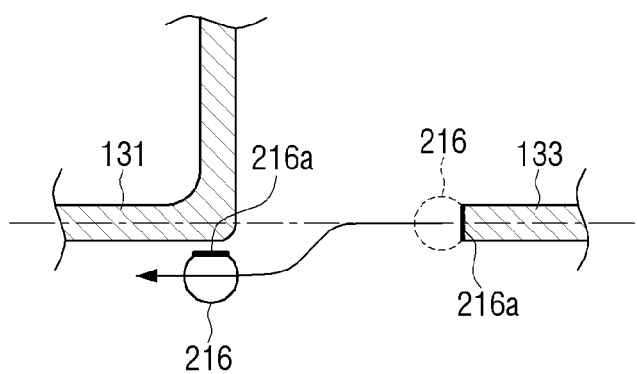
FIGS. 11A and 11B are views provided to explain another method for shaping a shielding dam in the encircled section X of FIG. 7.
Figure 11B:
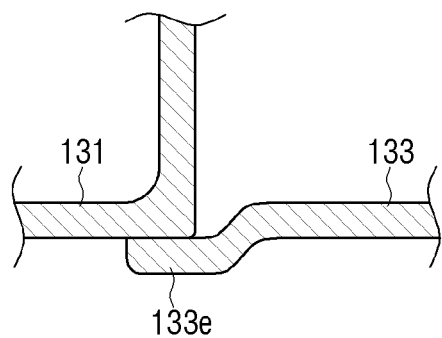

FIG. 7 is a view illustrating that the shielding dam is formed on the printed circuit board with an electroconductive material discharged along the moving path of the nozzle illustrated in FIG. 6. FIGS. 8A to 8C are views provided to explain a method for shaping the shielding dam in the encircled section VIII of FIG. 7. FIGS. 9A to 9C are views provided to explain another method for shaping the shielding dam in the encircled section VIII of FIG. 7. FIGS. 10A to 10C are views provided to explain a method for shaping the shielding dam in the encircled section X of FIG. 7. FIGS. 11A and 11B are views provided to explain another method for shaping the shielding dam in the encircled section X of FIG. 7.

Referring to FIG. 7, the shielding dam 130 may be formed through one material discharge process with respect to the two shielding regions A1, A2 (see FIG. 3) set in the printed circuit board 110.

As described above with reference to FIG. 5, the shielding dam 130 may include first to third portions 131, 132, 133 and may partition the two shielding regions A, A2 while forming the closed loop overall. One (e.g., shielding region A1) of these may form the closed loop with the first and second portions 131, 132, and the other (e.g., shielding region A2) may form the closed loop with the second and third portions 132, 133. In this case, the second portion 132 may serve as a border between the shielding regions A1, A2.

According to an exemplary embodiment, because the two shielding regions A1, A2 may be partitioned by the second portion 132 alone, there is no need for a space to ensure an interval between shield cans, which is different from the related art shielding structure using the shield cans. Accordingly, because the space may be omitted, more space for the mounting region can be provided for the circuit devices. Further, there are advantages in which a process for manufacturing another shield can before formation of the shielding structure may be omitted, and a product cost may be lowered as a shield can having a high material cost is not used. Further, even when designs of shielding regions (e.g., outline of the shielding region) are different from each other, a moving path of the nozzle may be modified correspondingly to the design of a corresponding shielding region through the inputter 253 of the material discharge device 200. Therefore, work flexibility can be maximized.

When the adjacent shielding regions A1, A2 are formed, the shielding dam 130 is required to block the EMI from the shielding regions by allowing each of the portions 131, 132, 133 of the shielding dam 130 to form the complete closed loop. For the above, according to an exemplary embodiment, when the shielding dam 130 is formed on the two shielding regions A1, A2 with one material discharge process, a certain gap may be formed at a point where a first shaped portion of the shielding dam 130 meets a later shaped portion (see FIGS. 8A and 10B).

According to an exemplary embodiment, in order to prevent such gap from being formed, various shielding dam shaping methods described below are provided.

First, a method for preventing a gap generated at the section VIII illustrated in FIG. 7, i.e., at a point R4 (see FIG. 5) connecting the starting point S (see FIG. 5) of the first portion 131 with the second and third portions 132, 133 will be described.

As illustrated in FIG. 5, the first and second portions 131, 132 of the shielding dam 130 may be formed as the nozzle 216 starts from the starting point S and moves along the sections A, B, C, and D while continuously discharging a material.

The nozzle 216 arriving at an end of the section D may rotate as illustrated in FIG. 8A, in which a moving path of the nozzle 216 may be set by considering an outer diameter of the nozzle 216, so that a shape is not modified when pushed by the shielding dam 130 shaped at the starting point S. This may cause a gap to be formed at the starting point S and the point R4.

In order to remove such gap, the nozzle 216 may stop at a position where an axis L1 roughly coincident with the shielding dam 130 formed in the section A stops at an intersection between a certain point and another point having a certain gap g between the nozzle 216 and the starting point S. In this case, the first outlet 216a of the nozzle 216 may be disposed to be directed toward the starting point S of the first portion 131.

Next, a material 133a may be discharged toward the starting point S, as illustrated in FIG. 8B. Accordingly, as illustrated in FIG. 8A, a material 132a previously discharged from the nozzle 216 may be pushed to a side of the starting point S by the material 133a discharged from the nozzle 216, as illustrated in FIG. 8B, to a tight contact with the first portion 131, thus filling a gap between the starting point S and the point R4.

When the gap is filled, the nozzle 216 may move along a predetermined moving path of the nozzle while discharging the material 133b to shape the third portion 133, as illustrated in FIG. 8C.

Further, referring to FIGS. 9A to 9C, another method for filling a gap between the starting point S and the point R4 will be explained below.

As illustrated in FIG. 9A, the nozzle 216 may stop at a position where an axis L1 roughly coincident with the shielding dam 130 formed in the section A stops at an intersection between a certain point and another point having a certain gap g between the nozzle 216 and the starting point S. In this case, the first outlet 216a of the nozzle 216 may be disposed to be directed toward the starting point S of the first portion 131.

As illustrated in FIG. 9B, the nozzle 216 may then move by a certain distance to the starting point S. The nozzle 216 may move until shortly before arriving at the starting point S. Accordingly, as illustrated in FIG. 9A, the material 132a previously discharged from the nozzle 216 may be pushed to a side of the starting point S by the nozzle 216 into a tight contact with one side of the first portion 131, as illustrated in FIG. 9B. In this state, the nozzle 216 may move along a predetermined moving path of the nozzle while discharging the material 133b to shape the third portion 133, as illustrated in FIG. 9C. In this case, the material 133b discharged from the nozzle 216 may be tightly contacted with the first portion 131 corresponding to the starting point S, thus filling a gap between the starting point S and the point R4.

Next, a method for preventing a gap from generating at a portion X illustrated in FIG. 7, i.e., at the point R3 (see FIG. 5) connecting the first and second portions 131, 132 and the ending point E (see FIG. 5) of the third portion 133 will be described below by referring to FIGS. 10A to 10C.

FIG. 10A is a top view illustrating a portion connecting the point R3 and the ending point E, and FIG. 10B is a view illustrating a portion connecting the point R3 and the ending point E from the direction B shown in FIG. 10A.

Referring to FIG. 10B, when the nozzle 216 arrives at the ending point E while forming the third portion 133, the nozzle 216 pushes the first portion 131 of the previously formed shielding dam 130 to move to a relatively higher position than a height of the shielding dam 130 to ensure that a shape of the first portion 131 (or the point R3) is not deformed.

In such upward motion, when the nozzle 216 moves with the same speed with the speed the nozzle 216 shapes the third portion 133, a certain space 135 may be formed between the point R3 and the ending point E, as illustrated in FIG. 10B. In order to remove such space 135, the nozzle 216 may slow a moving speed in a section C2 including the point R3 and the ending point E compared to a moving speed in a section C1 where the nozzle 216 shapes the third portion 133. As a result, the space 135 may be filled with a material 135d discharged from the nozzle 216.

Although in this exemplary embodiment the space 135 is filled by controlling a moving speed of the nozzle 216, embodiments are not limited thereto and the space 135 may be filled by moving the nozzle at uniform speed, while increasing an amount of material discharged in the section C2.

Further, referring to FIGS. 11A and 11B, another method for removing a gap between the point R3 and the ending point E will be described below according to an exemplary embodiment.

Referring to FIG. 11A, the nozzle 216 may move toward the ending point E and then move, at the same height as the current height, toward one side of the point R3 (i.e., outside the first portion 131). When forming the third portion 133, the nozzle 216 may be positioned such that the first outlet 216a is opposite the direction in which the nozzle 216 is moving, and then the nozzle 216 may rotate counter-clockwise upon moving toward one side of the point R3 so as to discharge the material 133e to one side of the first portion 131. Such a change in the direction of the first outlet 216a may be performed by driving the rotation driver 219 of the material discharge device 200.

FIGS. 12A to 12E are views illustrating various nozzle moving paths to form the shielding dam along peripheries of the two adjacent shielding regions with one material discharge process.

Figure 12A:
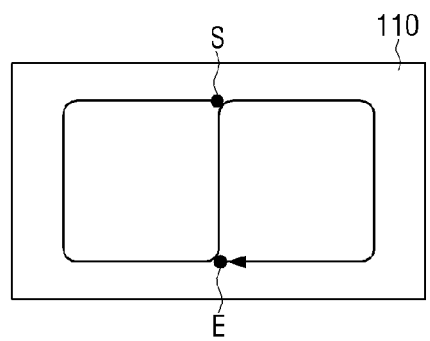
FIGS. 12A, 12B, 12C, 12D and 12E are views illustrating various nozzle moving paths to form a shielding dam along peripheries of two adjacent shielding regions with one material discharge process according to exemplary embodiments.

The nozzle moving path illustrated in FIG. 12A is an example of sequential forming of the first portion 131, the second portion 132, and the third portion 133 of the shielding dam 130.

Figure 12D:
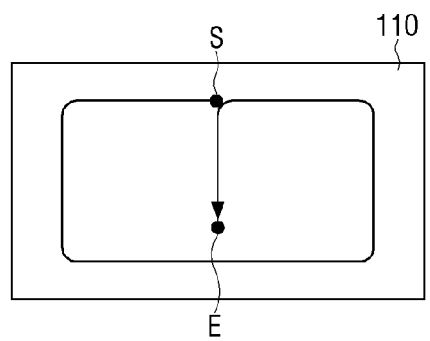
Figure 12B:
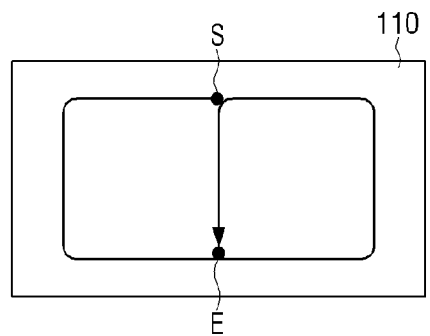

The nozzle moving path illustrated in FIG. 12B is an example of final forming of the second portion 132 connected to the third portion 133, following the successive forming of the first portion 131 and the third portion 133 of the shielding dam 130.

Figure 12E:
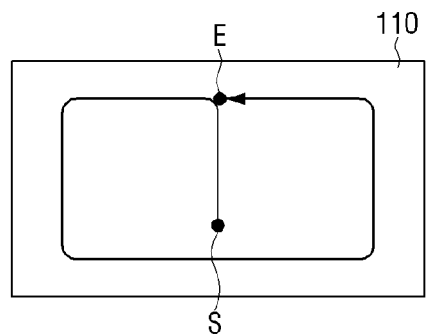
Figure 12C:
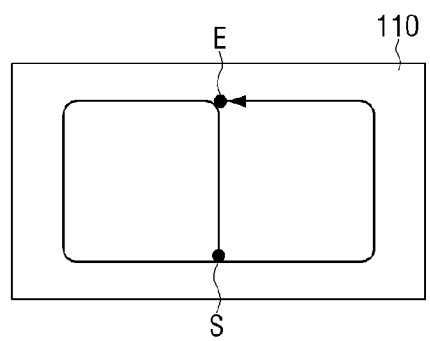

The nozzle moving path illustrated in FIG. 12C is an example of first forming of the second portion 132 of the shielding dam 130, followed by successive forming of the first portion 131 and the third portion 133. In this case, it is of course possible that the nozzle moving path may be modified such that the second portion 132 is formed, followed by successive forming of the third portion 133 and the first portion 131.

FIGS. 12D and 12E respectively illustrate a nozzle moving path according to which the second portion 132 does not form two shielding regions A1, A2 into independent closed loops. As described above, the shielding dam may be shaped in a manner that the shielding dam does not completely partition the two shielding regions A1, A2 when it is considered that EMI generated from the circuit devices mounted in the shielding regions A1, A2 would not considerably affect the circuit devices mounted in the shielding regions A1, A2.

FIGS. 13A to 13D are views illustrating various nozzle moving paths to form the shielding dam along peripheries of the three adjacent shielding regions with two material discharge processes.

Figure 13A:
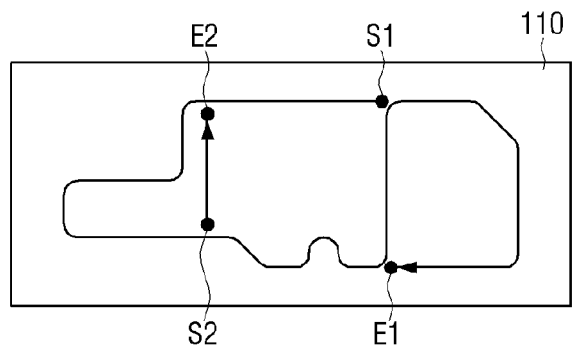
FIGS. 13A, 13B, 13C and 13D are views illustrating various nozzle moving paths to form a shielding dam along peripheries of three adjacent shielding regions with two material discharge processes according to exemplary embodiments.
Figure 13B:
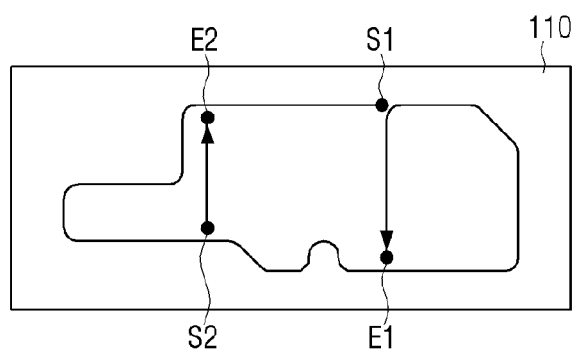
Figure 13C:
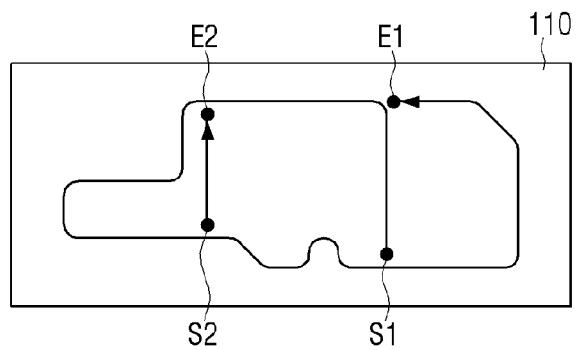

A nozzle in an example of shielding the three adjacent shielding regions disposed on a straight line may have a moving path to form the shielding dam for surrounding two shielding regions, by moving from the first starting point S1 to the first ending point E1 in the first material discharge process, as illustrated in FIGS. 13A to 13C. Next, in order to partition one of the two shielding regions, the nozzle may move from the second starting point S2 to the second ending point E2 in the second material discharge process, thus forming the shielding dam.

Figure 13D:
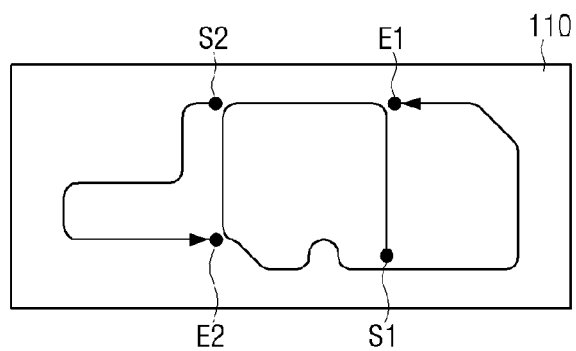

Further, a nozzle in FIG. 13D may have moving path to form the shielding dam for surrounding two shielding regions by moving from the first starting point S1 to the first ending point E1 in the first material discharge process, and by moving from the second starting point S2 to the second ending point E2 on one side of the two shielding regions in the second material discharge process.

Figure 14:
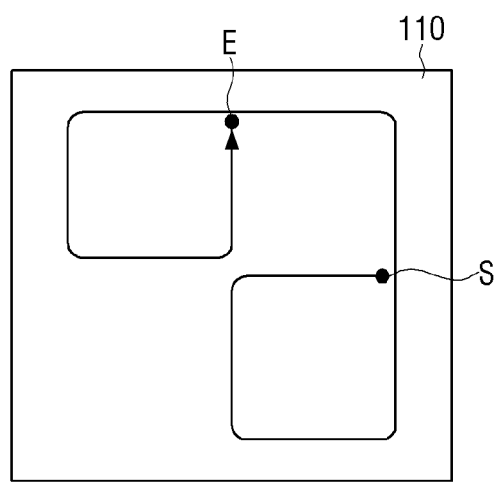
FIG. 14 is a view illustrating a nozzle moving path to form a shielding dam along peripheries of three adjacent shielding regions with one material discharge process according to an exemplary embodiment.

When the three shielding regions are roughly formed to be in an L shape rather than being disposed on a straight line as described above, the shielding dam may be formed by the one material discharge process, as illustrated in FIG. 14.

FIG. 14 is a view illustrating a nozzle moving path to form the shielding dam along peripheries of the three adjacent shielding regions with one material discharge process.

According to the nozzle moving path of FIG. 14, the shielding dam of a first shielding region starting from the starting point S may be formed, then peripheries of second and third shielding regions may be formed, and then the shielding dam to partition the second and third shielding regions may be formed. In this case, two portions corresponding to sections that partition the three shielding regions may be contacted at one ends thereof.

Hereinbelow, an exemplary embodiment in which a portion of the shielding dam (starting portion, ending portion, and intersecting portion of shaping the shielding dam) is shaped in a state of being supported by a dummy member will be described.

Figure 15A:
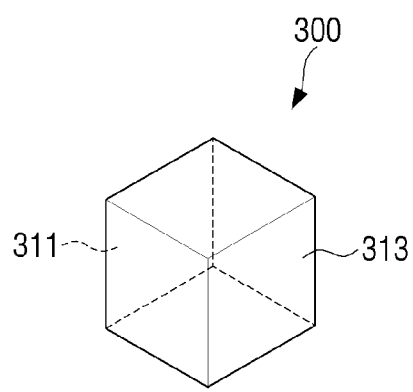
FIGS. 15A and 15B are views illustrating a dummy member for supporting a portion of a shielding dam according to an exemplary embodiment.
Figure 15B:
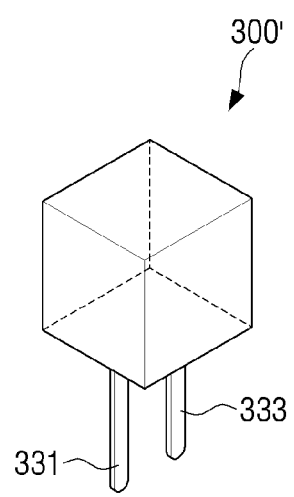
Figure 16A:
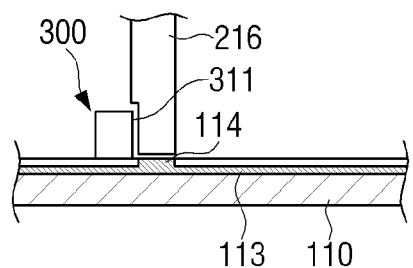
FIGS. 16A and 16B are views illustrating a method for shaping a shielding dam using a dummy member according to an exemplary embodiment.

FIGS. 15A and 15B are perspective views illustrating a dummy member for supporting a portion of the shielding dam, and FIGS. 16A and B are views provided to explain a method for forming the shielding dam by using the dummy member.

Referring to FIG. 15A, the dummy member 300 may be mounted on the printed circuit board 110 through a reflow process. In other words, the dummy member seated on the solder formed on the printed circuit board 110 may be mounted on the printed circuit board when the solder is melted with high heat.

Further, as illustrated in FIG. 15B, the dummy member 300' may include two lead wires 331, 333. In this case, the dummy member 300' may possibly be any structure as long as the dummy member has a structure that can be fixed on the printed circuit board 110 instead of the lead wires (e.g., structure that can be fastened with a screw or a related art clamping structure).

Hereinbelow, it is exemplified that the dummy member is mounted on the printed circuit board 110 through a reflow process without the lead wires 331, 333.

The dummy member 300 may construct a shielding structure in cooperation with the shielding dam, in which case the dummy member 300 may be comprised of a material that may shield the EMI to perform an EMI shielding function. For example, the dummy member 300 may be fabricated separately with a metal material that can shield the EMI or with the material of the shielding dam described above.

A material discharged from the nozzle may be supported on one side of the dummy member 300. To this end, the dummy member 300 may include at least one support side 311 or a plurality of support sides 311, 313, on which the material is supported.

Figure 16B:
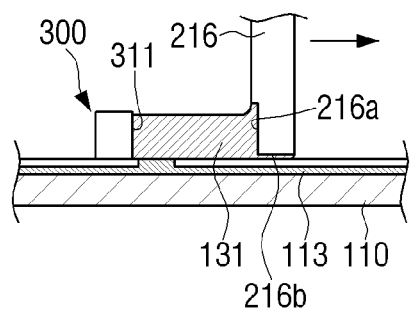

When the shielding dam is formed by using the dummy member 300, as illustrated in FIG. 16A, it is set such that the first outlet 216a of the nozzle 216 may be directed toward the support side 311 of the dummy member 300 fixed on the printed circuit board 110. Thereafter, the shielding dam 130 may be formed by moving the nozzle 216 in a direction of being distanced farther away from the dummy member 300 while discharging a material toward the support side 311 of the dummy member 300, as illustrated in FIG. 16B. In this case, a starting portion of the shielding dam 130 may be formed firmly because it is supported by the support side 311 of the dummy member 300.

Figure 17:
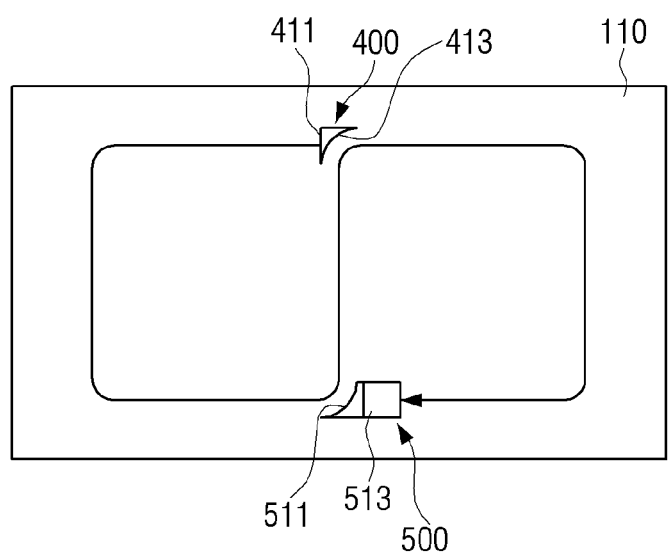
FIG. 17 is a view illustrating an example in which two dummy members are disposed on different positions from each other when forming a shielding dam along peripheries of two adjacent shielding regions according to an exemplary embodiment.
Figure 18:
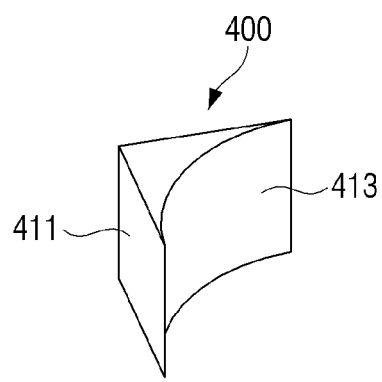
FIGS. 18 and 19 are views respectively illustrating the two dummy members illustrated in FIG. 17 according to exemplary embodiments.
Figure 19:
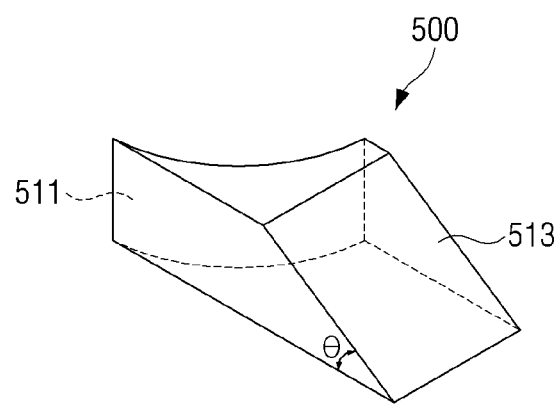
Figure 20:
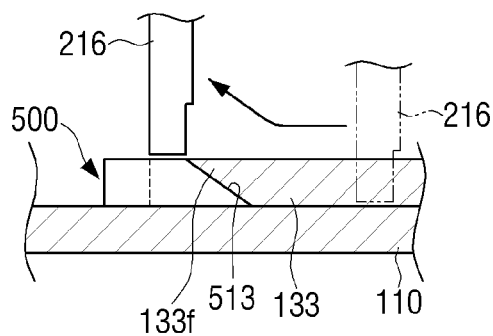
FIG. 20 is a view illustrating a method for shaping a portion of a shielding dam using the dummy member illustrated in FIG. 19 according to an exemplary embodiment.

FIG. 17 is a view provided to explain an exemplary embodiment in which two dummy members are disposed on different positions from each other when the shielding dam is formed along peripheries of the two adjacent shielding regions, FIGS. 18 and 19 are perspective views respectively illustrating two dummy members of FIG. 17, and FIG. 20 is a view provided to explain a method for shaping a portion of the shielding dam by using the dummy member illustrated in FIG. 19.

Referring to FIG. 17, when the shielding dam is formed with respect to two adjacent shielding regions by one material discharge process, two dummy members may be used. The first dummy member 400 may be positioned on a starting point of the nozzle moving path, and the second dummy member 500 may be positioned on an ending point of the nozzle moving path.

In the first dummy member 400, the first support side 411 may be formed roughly as a plane, and the second support side 413 may be formed as a curved plane, as illustrated in FIG. 18. In this case, the first and second support sides 411, 413 may be disposed approximately vertically with respect to the upper surface of the printed circuit board 110.

In one material discharge process, a material first discharged from the nozzle may be supported on the first support side 411 of the first dummy member 400, and a material discharged from the nozzle on the point R4 may be supported on the second support side 413 of the first dummy member 400. In order to allow the material discharged from the nozzle to be supported on the second support side 413 of the first dummy member 400, the nozzle passing through point R4 may move in rotating motion, thus allowing the first outlet 216a to be directed toward the second support side 413 of the first dummy member 400.

In the second dummy member 500, the first support side 511 may be formed as a curved plane, and the second support side 513 may be formed as a plane, as illustrated in FIG. 19. In this case, the first support side 511 may be disposed to be approximately vertical with respect to the upper surface of the printed circuit board 110, and the second support side 513 may be disposed at a slope by a certain angle θ with respect to the upper surface of the printed circuit board 110.

The first support side 511 of the second dummy member 500 may support a material discharged from the nozzle on the point R3. In this case, in order for the material discharged from the nozzle to be supported on the first support side 511 of the second dummy member 500, the nozzle passing through point R3 may move in a rotating motion, thus allowing the first outlet 216a to be directed toward the first support side 511 of the second dummy member 500.

On the second support side 513 of the second dummy member 500, the nozzle 216 may form the third portion 133, and upon arriving at the ending point E, may upwardly move along the second support side 513 of the second dummy member 500, as illustrated in FIG. 20. At this time, the material discharged from the nozzle may be formed on the second support side 513 of the second dummy member 500. In this case, as illustrated in FIG. 10C, even when the nozzle 216 moves at a uniform speed without changing a moving speed with respect to respective sections while discharging the material, the space 135 is not formed.

Figure 21:
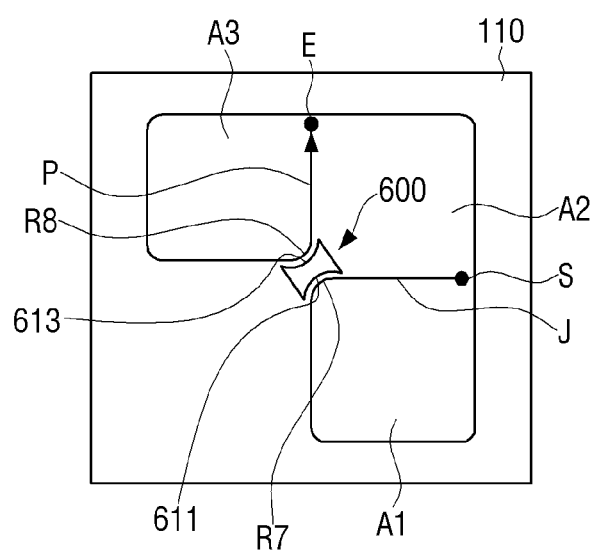
FIG. 21 is a view illustrating an example in which one dummy member is disposed at an intersecting portion between shielding dams when the shielding dams are formed along peripheries of three adjacent shielding regions according to an exemplary embodiment.
Figure 22:
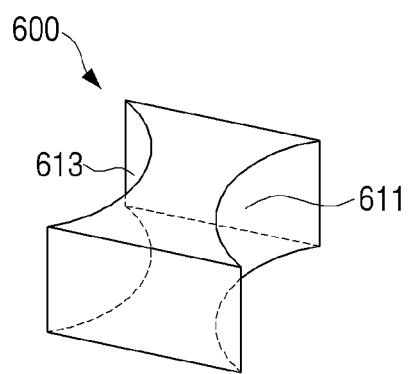
FIG. 22 is a perspective view illustrating the dummy member of FIG. 21 according to an exemplary embodiment.

FIG. 21 is a view illustrating an exemplary embodiment in which one dummy member is disposed on an intersecting portion between the shielding dams when the shielding dams are formed along peripheries of the three adjacent shielding regions, and FIG. 22 is a perspective view illustrating the dummy member of FIG. 21.

Referring to FIG. 21, when the shielding dam is formed by one material discharge process with respect to three adjacent shielding regions which are disposed in an L shape, one dummy member may be used. The dummy member 600 may be disposed on a position where sections J and P, each partitioning the adjacent shielding regions to the nozzle moving path, are contacted with each other at one ends thereof.

The dummy member 600 may include the first and second support sides 611, 613 which are formed respectively as curved planes on both sides, as illustrated in FIG. 22. The first and second support sides 611, 613 of the dummy member 600 may be disposed approximately vertically with respect to the upper surface of the printed circuit board 110.

The first support side 611 of the dummy member 600 is where a material discharged from the nozzle at a point R7 is supported, and the second support side 613 is where a material discharged from the nozzle at a point R8 is supported. In this case, in order for a material discharged from the nozzle to be supported on the first and second support sides 611, 613 of the dummy member 600, respectively, the nozzle passing through the points R7 and R8 may move in a rotating motion, thus allowing the first outlet 216a to be directed toward the first and second support sides 611, 613 of the first dummy member 400, respectively.

As described above, according to an exemplary embodiment, the shielding dam may be formed more firmly by using the dummy member.

The foregoing exemplary embodiments and advantages are merely exemplary and are not to be construed as limiting the exemplary embodiments. The present teaching can be readily applied to other types of apparatuses. Also, the description of the exemplary embodiments of the present inventive concept is intended to be illustrative, and not to limit the scope of the claims.

What is claimed is:

1. A manufacturing method of an electromagnetic interference (EMI) shielding structure, the method comprising:
   forming a shielding dam on a printed circuit board by continuously discharging an electroconductive material through a nozzle, the shielding dam forming a closed loop that defines a periphery of adjacent shielding regions of the printed circuit board;
   forming an insulating member on the adjacent shielding regions within the shielding dam, the insulating member covering circuit devices provided in the adjacent shielding regions;

forming a shielding member by covering an upper surface of the insulating member with the electroconductive material; and prior to the forming the shielding dam, disposing at least one dummy member on a corner of a moving path of the nozzle, wherein, in the forming the shielding dam, the nozzle moves, while discharging the electroconductive material, toward one surface of the dummy member wherein, in the forming the shielding dam, when the one surface of the dummy member is a sloped surface, the nozzle moves upwardly along the slope surface of the dummy member, while discharging the electroconductive material toward the sloped surface of the dummy member.

2. The manufacturing method of claim 1, wherein the forming the shielding dam comprises forming a border portion and a partition portion of the shielding dam of the shielding dam continuously by one material discharge process, the border portion surrounding the adjacent shielding regions, and the partition portion being disposed between the adjacent shielding regions and within the border portion.

3. The manufacturing method of claim 1, wherein the forming the shielding dam comprises:

moving the nozzle while the nozzle discharges the electroconductive material;

stopping the nozzle at a position that is a certain distance apart from a previously formed portion of the shielding dam;

while the nozzle is stopped, filling a space between the previously formed portion and the position of the nozzle by discharging the electroconductive material toward the previously formed portion; and resuming moving the nozzle while the nozzle discharges the electroconductive material.

4. The manufacturing method of claim 1, wherein the forming the shielding dam comprises:

moving the nozzle while the nozzle discharges the electroconductive material;

stopping the nozzle at a position that is a certain distance apart from a previously formed portion of the shielding dam;

moving the nozzle to a position adjacent to the previously formed portion so that the electroconductive material previously discharged from the nozzle is pushed toward and contacts the previously formed portion; and resuming moving the nozzle while the nozzle discharges the electroconductive material toward the previously formed portion.

5. The manufacturing method of claim 1, wherein the forming the shielding dam comprises:

while the nozzle discharges the electroconductive material, moving the nozzle at a first speed to a first position adjacent to a previously formed portion of the shielding dam; and while the nozzle discharges the electroconductive material, moving the nozzle upwardly at a second speed from the first position to a second position that is higher than the previously formed portion, wherein the second speed is slower than the first speed.

6. The manufacturing method of claim 1, wherein, in the forming the shielding dam, the nozzle discharges the electroconductive material to contact at least two portions of a previously formed portion of the shielding dam while moving from a starting point to an ending point of the shielding dam.

* * * * *